US008709622B2

(12) United States Patent
Jang et al.

(10) Patent No.: US 8,709,622 B2
(45) Date of Patent: Apr. 29, 2014

(54) PROTECTIVE CIRCUIT BOARD AND BATTERY PACK USING THE SAME

(75) Inventors: Young-Cheol Jang, Suwon-si (KR); Eun-Ok Kwak, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 491 days.

(21) Appl. No.: 12/257,893

(22) Filed: Oct. 24, 2008

(65) Prior Publication Data
US 2009/0154048 A1 Jun. 18, 2009

(30) Foreign Application Priority Data
Dec. 17, 2007 (KR) .................. 10-2007-0132352

(51) Int. Cl.
*H01M 2/02* (2006.01)
*H01M 14/00* (2006.01)

(52) U.S. Cl.
USPC ................................ 429/7; 429/178; 429/179

(58) Field of Classification Search
USPC ................................ 429/7, 178–179; 361/106
See application file for complete search history.

(56) References Cited

U.S. PATENT DOCUMENTS

| 5,472,804 | A * | 12/1995 | Austin et al. .................... 429/99 |
| 6,531,662 | B1 | 3/2003 | Nakamura |
| 6,994,926 | B2 | 2/2006 | Ikeuchi et al. |
| 2003/0157399 | A1 * | 8/2003 | Ikeuchi et al. .................. 429/62 |
| 2003/0180582 | A1 * | 9/2003 | Masumoto et al. ............... 429/7 |
| 2004/0043663 | A1 * | 3/2004 | Ikeda et al. .................... 439/627 |
| 2005/0271934 | A1 | 12/2005 | Kiger et al. |
| 2007/0020509 | A1 * | 1/2007 | Kim ................................ 429/62 |
| 2007/0160878 | A1 * | 7/2007 | Kim et al. ........................ 429/7 |
| 2007/0202396 | A1 * | 8/2007 | Jung ............................ 429/174 |
| 2008/0008910 | A1 | 1/2008 | Koh |

FOREIGN PATENT DOCUMENTS

| CN | 1348677 A | 5/2002 |
| JP | 2001-143672 | 5/2001 |
| JP | 2001-250520 | 9/2001 |
| JP | 2002-8608 | 1/2002 |
| JP | 2003-17012 | 1/2003 |

(Continued)

OTHER PUBLICATIONS

English translation of JP 2003-017012 (cited on May 11, 2010 IDS, relied upon for rejection). Published Jan. 17, 2003.*

(Continued)

*Primary Examiner* — Eugenia Wang
(74) *Attorney, Agent, or Firm* — Knobbe Martens Olson & Bear LLP

(57) ABSTRACT

A protective circuit board and a battery pack using the protective circuit board broadens a mount region of a device and improves operability and processibility thereof. The battery pack comprises: a bare cell including a cap plate and an electrode terminal; and a protective circuit board positioned at the outside of the bare cell and formed of a flexible printed circuit board where a protection module, a positive temperature coefficient thermistor, and first and second power terminals are mounted. Accordingly, a space for mounting a number of protection devices and a space for forming a high current pattern are secured, and the work of mounting the protection devices and forming the high current pattern are easily performed. Furthermore, since any special structure for compensating a difference in the height of a protection device and an electrode terminal is not needed, the operability and processibility increase.

13 Claims, 11 Drawing Sheets

(56) References Cited

FOREIGN PATENT DOCUMENTS

| | | |
|---|---|---|
| JP | 2004-185861 | 7/2004 |
| JP | 2004-193066 | 7/2004 |
| JP | 2006-134946 | 5/2006 |
| JP | 2007-266067 | 10/2007 |
| JP | 2007-280813 | 10/2007 |
| KR | 2006-27251 | 3/2006 |
| KR | 10-704290 | 3/2007 |
| KR | 2007-55673 | 5/2007 |
| KR | 10-0760784 | 9/2007 |

OTHER PUBLICATIONS

Korean Notice of Allowance dated Mar. 11, 2010, issued in corresponding Korean Patent Application No. 10-2007-0132352.
Chinese Office Action dated Apr. 1, 2011 in Application No. 200810184098.5.
Chinese Office Action dated Jul. 21, 2011 in corresponding Chinese Patent Application No. 200810184098.5.
Extended European Search Report dated Nov. 21, 2012 in corresponding European Patent Application No. 08171372.9, which claims priority to Korean priority application 10-2007-0132352.

* cited by examiner

PROTECTIVE CIRCUIT BOARD AND BATTERY PACK USING THE SAME

CROSS-REFERENCE TO RELATED APPLICATIONS

This application claims benefit of Korean Patent Application No. 2007-132352, filed Dec. 17, 2007, the disclosure of which is incorporated herein by reference.

BACKGROUND OF THE INVENTION

1. Field of the Invention

Aspects of the present invention relate to a protective circuit board and a battery pack using the same, and more particularly, to a protective circuit board and a battery pack using the same that broadens a mount region of a device and improves operability and proccessability.

2. Description of the Related Art

A secondary battery can be repeatedly used by repeating charging and discharging. Therefore, a secondary battery is economical compared to a disposable battery. These days, as a secondary battery has high capacity in a small size, secondary batteries are widely used as an electricity source of portable electronic/electric products, such as mobile phones, camcorders, notebook computers, and the like.

Examples of a secondary battery include a nickel cadmium battery, a nickel metal hydride battery, a nickel zinc battery, a lithium secondary battery, and the like. Among these batteries, a lithium secondary battery has been widely used because it is manufactured to be small in size and to have high capacity and has a high operating voltage and a high energy density per unit weight.

A lithium secondary battery can be classified into a can type and a pouch type according to a type of a cell case in which an electrode assembly is disposed. The electrode assembly includes a positive electrode plate, a negative electrode plate, and a separator disposed therebetween. The can type can be further classified into a cylinder type and a prismatic type.

When a lithium secondary battery is of the can type, a cell case is generally formed of a metal, such as aluminum, and the can type may be a cylinder type, prismatic shape, or a post type having curved edges.

An opening is formed at one side of a can. After an electrode assembly and an electrolyte are disposed in the can through the opening, the opening is sealed by a cap assembly, thereby completing a secondary battery.

During manufacture or use of the secondary battery, an explosion or firing may occur due to abnormal operations, such as over-charging, over-discharging, or over-current, and the like. Therefore, the secondary battery is used, by being connected to a protective circuit board on which protection devices are mounted to prevent an accident.

At one side of the protective circuit board, there are mounted the protection devices, such as a positive temperature coefficient (PTC) thermistor, a charging/discharging device, a charging/discharging control unit, a resistor, a capacitor, and the like. At the other side of the protective circuit board, there is mounted an external connection terminal to be connected to an external set.

A secondary battery needs to be small, to have high capacity, and to secure safety. However, there are many limitations in securing a space for mounting a number of protection devices within a limited region of the protective circuit board and in securing a space for forming a high current pattern.

Moreover, even though the space for mounting a number of the protection devices and the space for forming the high current pattern are secured, there are still difficulties in mounting the protection devices and forming the high current pattern within the limited region.

Moreover, since the height of a protection device being mounted is higher than that of an electrode terminal protruding outward from the secondary battery, a height, which corresponds to the difference in the height between the protection device and the electrode terminal, needs to be compensated for so that the protection device is properly mounted.

SUMMARY OF THE INVENTION

Aspects of the present invention provide a protective circuit board and a battery pack using the same that broadens a mount region of a device and improves operability and proccessability.

Aspects of the present invention provide a protective circuit board including a flexible printed circuit board, and a protection module, a PTC thermistor, and first and second power terminals mounted on the flexible printed circuit board.

Aspects of the present invention provide a battery pack including a bare cell including a cap plate and an electrode terminal and a protective circuit board positioned outside the bare cell and formed of a flexible printed circuit board on which a protection module, a PTC thermistor, and first and second power terminals are mounted.

According to aspects of the present invention, the protective circuit board may include a first region where the protection module, the PTC thermistor, and the first and second power terminals are mounted, and a second region where an external connection terminal to be connected to an external device and a wire for connecting the first and second power terminals to the external connection terminal are formed.

According to aspects of the present invention, the protective circuit board may include a third region disposed to oppose to the second region about the first region.

According to aspects of the present invention, the external connection terminal may be disposed at the bottom of the bare cell.

According to aspects of the present invention, the external connection terminal may be disposed at a side of the bare cell at which the third region is disposed.

According to aspects of the present invention, the external connection terminal may be disposed so as to overlap the third region.

According to aspects of the present invention, the battery pack may further include a top cover disposed on a top side of the bare cell, and a bottom disposed on a bottom side of the bare cell.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
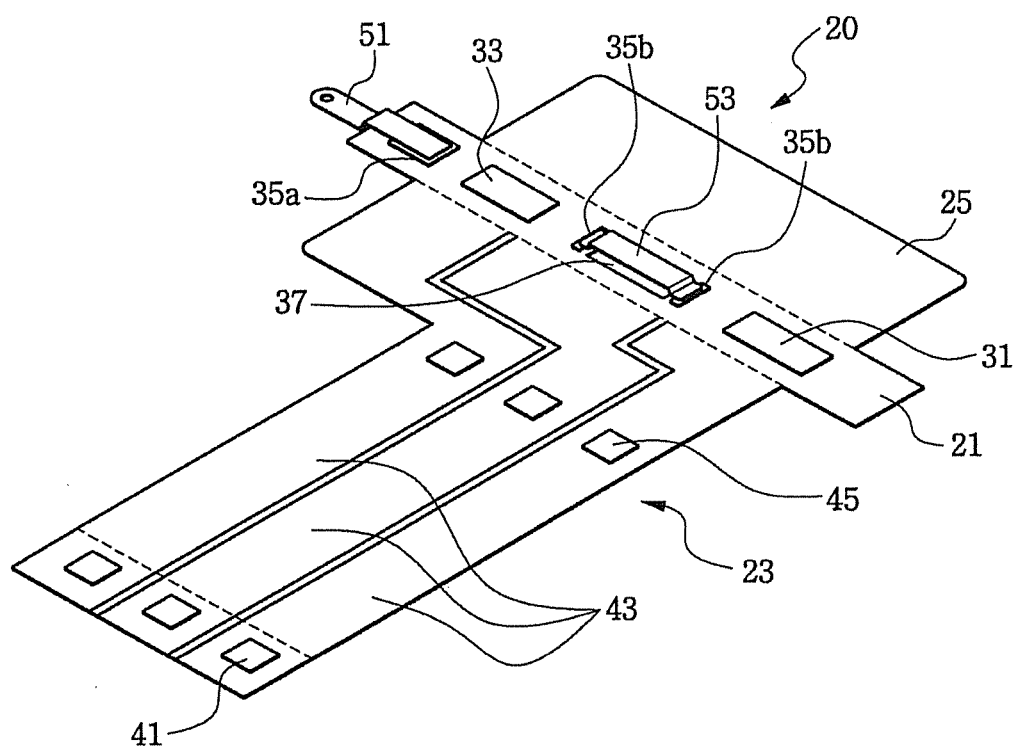
FIG. 1A is a perspective view of a protective circuit board according to an exemplary embodiment of the present invention, which is unfolded.

Reference will now be made in detail to the present exemplary embodiments of the present invention, examples of which are illustrated in the accompanying drawings, wherein like reference numerals refer to the like elements throughout. The embodiments are described below in order to explain the present invention by referring to the figures. In the drawings, the thickness and length of layers and regions are exaggerated for clarity. It will be understood that when an element is referred to as being "disposed on" or "connected to" another element, it may be directly disposed on or connected to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Figure 1B:
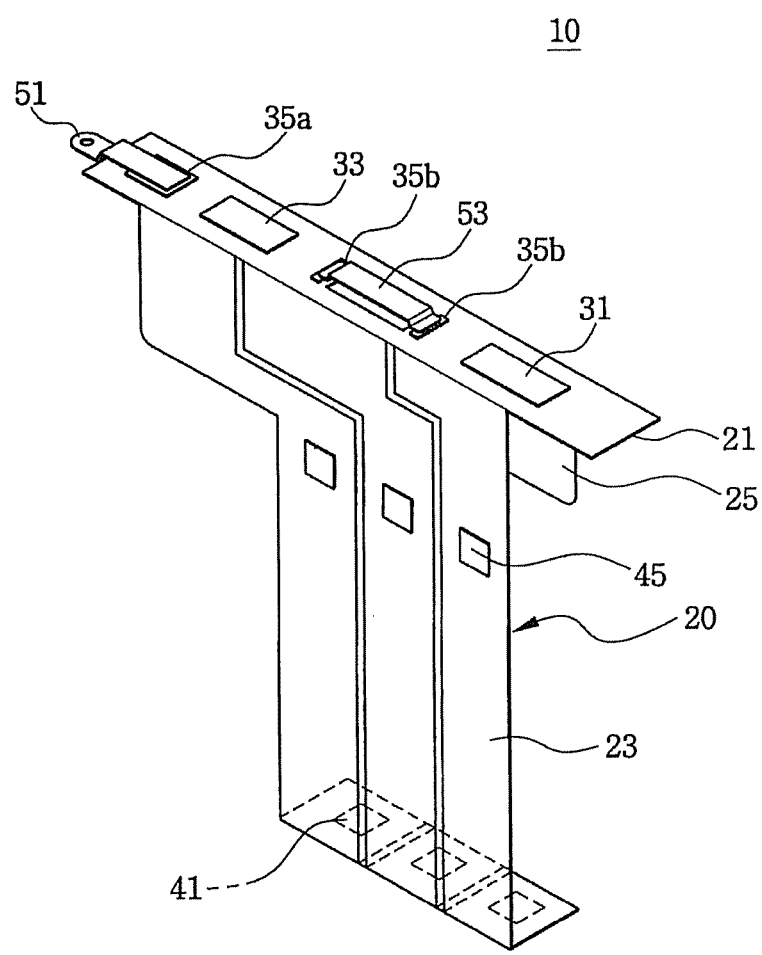
FIG. 1B is a perspective view of the protective circuit board of FIG. 1A, which is folded, along a dotted line.
Figure 1C:
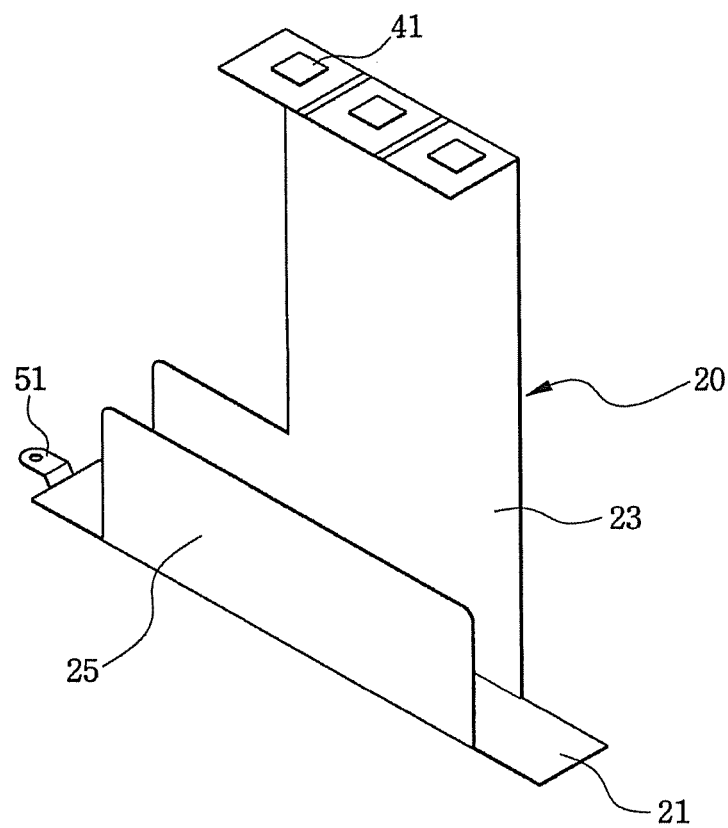
FIG. 1C is a perspective view of the protective circuit board of FIG. 1B, which is upside down.

FIG. 1A is a perspective view of a protective circuit board 10 according to an embodiment of the present invention, which is unfolded, FIG. 1B is a perspective view of the protective circuit board of FIG. 1A, which is folded along dotted lines of FIG. 1A, and FIG. 1C is a perspective view of the protective circuit board of FIG. 1B, which is upside down with respect to FIG. 1B.

With reference to FIGS. 1A through 1C, the protective circuit board 10 is formed by mounting various protection devices on a flexible printed circuit board (FPCB) 20 having predetermined regions.

Generally, the FPCB 20 is formed in a multilayer structure, wherein a wire comprising copper, nickel and/or others is formed on a flexible board formed of a insulating sheet, such as polyethylene terephthalate (PET), polyimide (PI) and the like, and a cover-lay which is a circuit protection insulating film stacked on the wire.

The FPCB 20 may have different shapes according to different aspects of the present invention. Although FIGS. 1A through 1C illustrate one embodiment to explain aspects of the present invention, the aspects of the present invention are not limited thereto.

The FPCB 20 comprises a first region 21 in which there are mounted a protection module 31 formed of a protection circuit and an electrical device and the like, a positive temperature coefficient (PTC) thermistor 33, and power terminals 35a and 35b.

Further, an aperture 37 is formed through the first region 21 and a second lead plate 53 is positioned to be partially exposed above the aperture 37, thereby providing a passage through which the second lead plate 53 is connected to a secondary battery (not shown).

The protection module 31 controls charging/discharging in abnormal operations, such as over-current, over-charging, over-discharging, internal pressure increase, and the like but is not limited thereto, thereby preventing any further current from flowing and thus preventing accidents, such as firing, explosion, and the like.

The protection module 31 may comprise a sensor resistor, a charging/discharging field effect transistor (FET), a fuse, a control unit, a temperature fuse, and/or others. The protection module 31 may additionally comprise passive devices, such as a capacitor, a resistor, and the like but is not limited thereto.

The power terminal 35a is connected to one side of a first lead plate 51 and the power terminal 35b is connected to one side of the second lead plate 53 to electrically connect the protective circuit board to the secondary battery.

Further, the FPCB 20 comprises a second region 23 in which there are formed an external connection terminal 41 to be connected to an external set and a wire 43 to connect the external terminal 41 to the power terminals 35a and 35b. The FPCB 20 may further comprise a test terminal 45 in the second region 23 where the wire 43 is formed to determine whether the FPCB 20 operates normally.

When the protective circuit board 10 is to be combined with a secondary battery, the FPCB 20 may comprise a third region 25 to strengthen the connection between the protective circuit board 10 and the secondary battery.

In this exemplary embodiment, the third region 25 is formed to oppose to the second region 23 about the first region 21. However, aspects of the present invention are not limited thereto.

When the protective circuit board 10 of FIG. 1A is folded along dotted lines shown in FIG. 1A, the second region 23 and the third region 25 positioned at either side of the first region 21 are shaped as illustrated in FIG. 1B. Further, the edge of the second region including the external connection terminal 41 may be folded as illustrated in FIGS. 1B and 1C. The second and third regions 23 and 25 may be folded at about 90 degrees but aspects of the present invention are not limited thereto such that the second and third regions 23 and 25 may be folded more so or less with respect to the first region 21.

Figure 2:
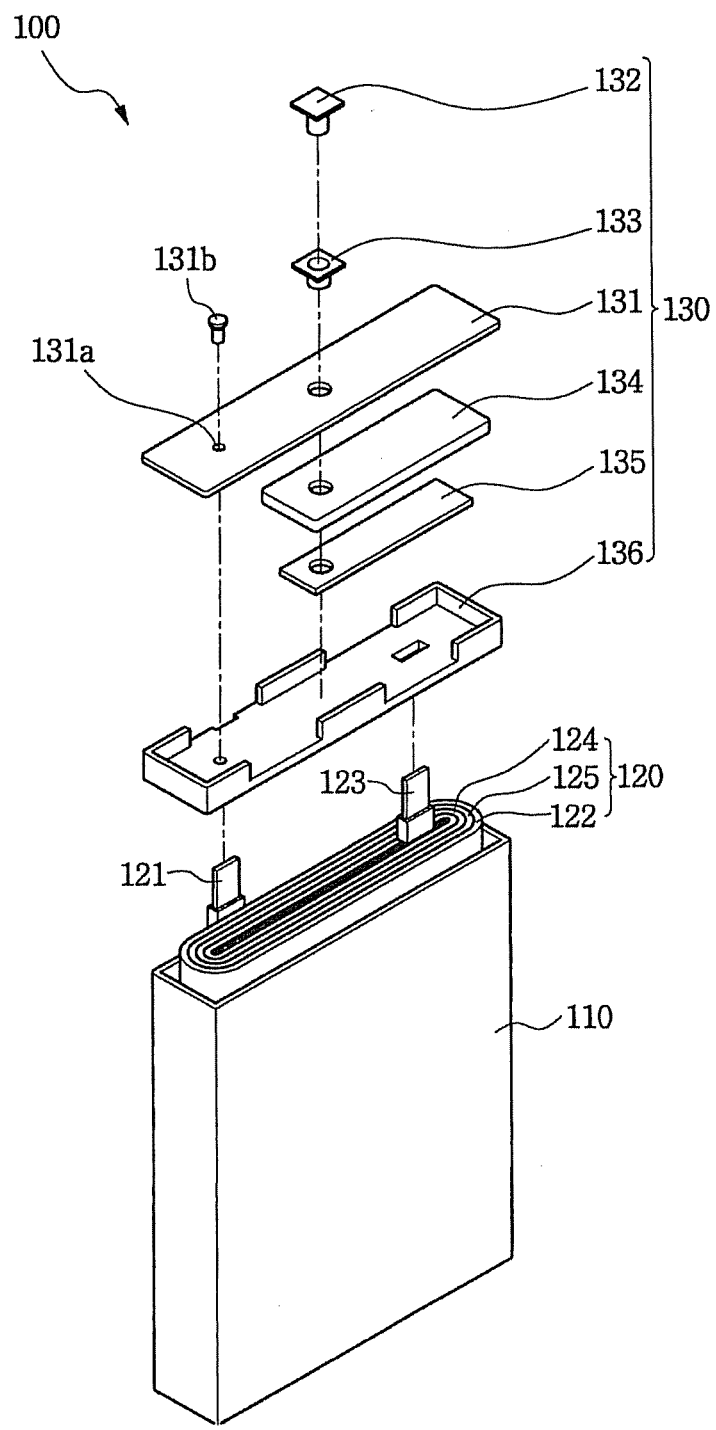
FIG. 2 is an exploded perspective view of a bare cell included in a battery pack according to another exemplary embodiment of the present invention.

FIG. 2 is an exploded perspective view of a bare cell 100 included in a battery pack according to another exemplary embodiment of the present invention. With reference to FIG. 2, the bare cell 100 comprises: a can 110 forming an outer shape; an electrode assembly 120 having a jelly-roll shape and being disposed inside the can 110; and a cap assembly 130 combined with one side of the can 110.

The can 110 may be formed of a metal material and includes an opening at its one side. The can 110 may be a cylindrical shape, a square shape, or a post shape with curved edges but is not limited thereto such that the can 110 may have a polygonal shape.

The electrode assembly 120 includes a first electrode plate 122 connected to a first electrode tab 121; a second electrode plate 124 connected to a second electrode tab 123; and a separator 125 disposed between the two electrode plates 122 and 124. The electrode assembly 120 is formed by rolling the first electrode plate 122, the separator 125, and the second electrode plate 124 together.

Each of the first electrode plate 122 and the second electrode plate 124 has an electrode collector coated with a slurry including an active electrode material, and a part uncoated with the slurry (called 'uncoated part'). The first electrode tab 121 is connected to the uncoated part of the first electrode plate 122, and the second electrode tab 123 is connected to the uncoated part of the second electrode plate 124.

The cap assembly 130 is formed of an electrode terminal 132 on a cap plate 131 and having a gasket 133 disposed therebetween to seal the opening of the can 110.

The electrode terminal 132 is electrically connected to a terminal plate 135 positioned under the cap plate 131. An insulating plate 134 is positioned between the cap plate 131 and the terminal plate 135 and insulates the cap plate 131 from the terminal plate 135.

An electrolyte injection hole 131a through which the electrolyte is injected is formed at one side of the cap plate 131. The electrolyte injection hole 131a is combined with an electrolyte injection hole stopper 131b so as to be sealed.

An insulating case 136 is positioned on the electrode assembly 120 and is received in the can 110. The insulating case 136 electrically insulates the electrode assembly 120 from the cap assembly 130 and prevents the movement of the electrode assembly 120.

The first electrode tab 121 electrically connected to the first electrode plate 122 is welded to the bottom of the cap plate 131, and the second electrode tab 123 electrically connected to the second electrode plate 124 is welded to the bottom of the terminal plate 135.

One side of the terminal plate 135 is connected to the second electrode tab 123 and the other side of the terminal plate 135 is connected to the electrode terminal 132, thereby forming an electrical passage between the second electrode tab 123 and the electrode terminal 132. The gasket 133 insulates the electrode terminal 132 from the cap plate 131.

Figure 3:
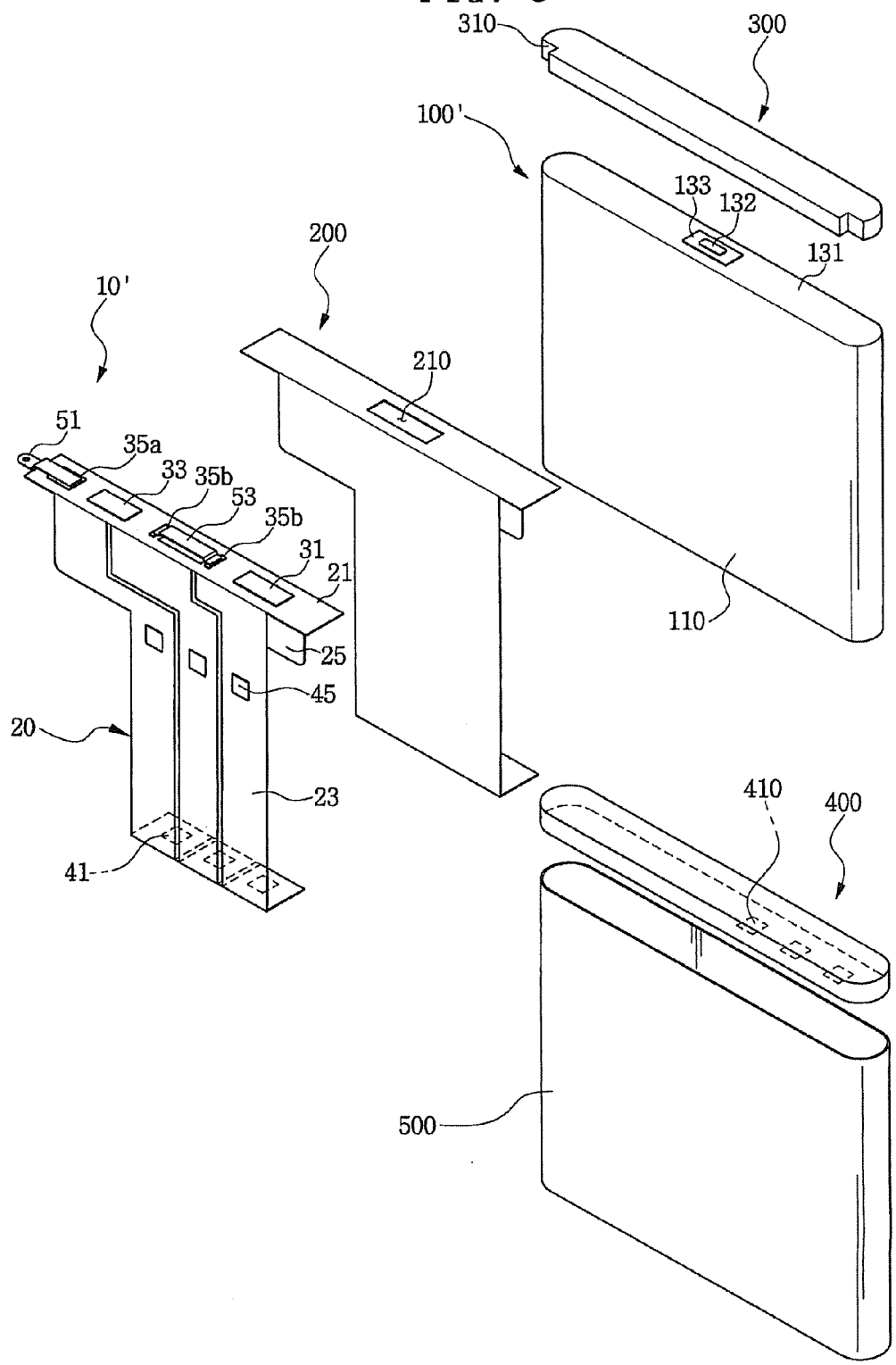
FIG. 3 is an exploded perspective view a battery pack according to another exemplary embodiment of the present invention.
Figure 4A:
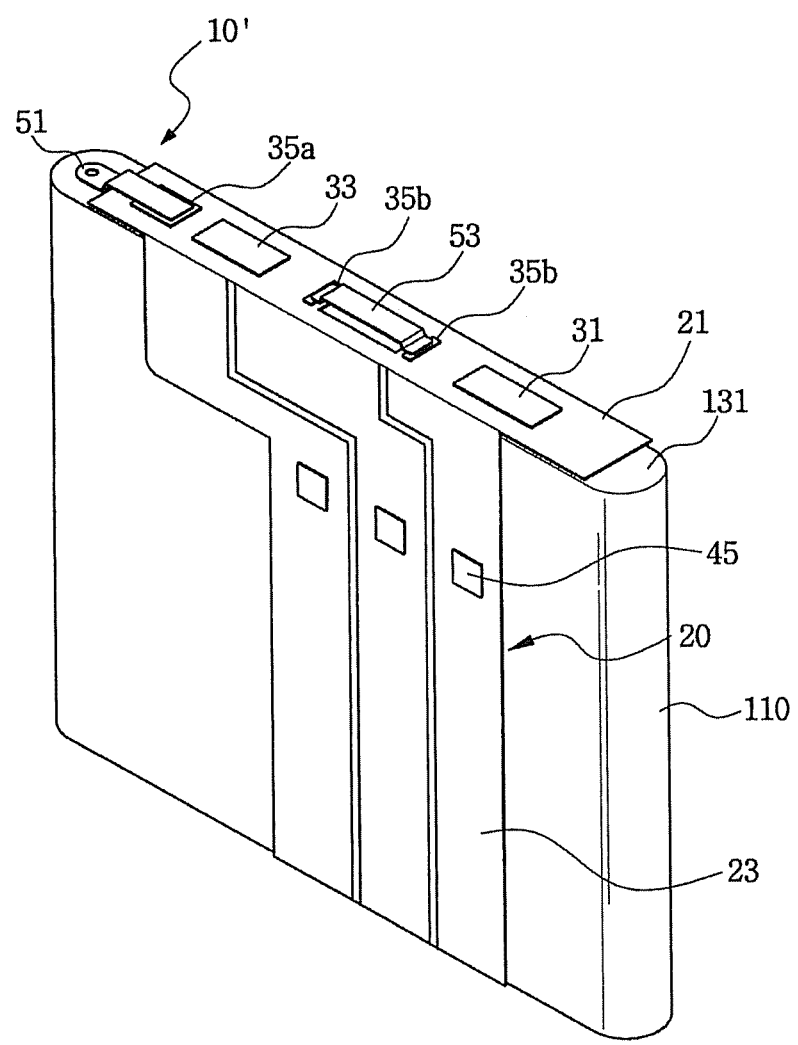
FIGS. 4A through 4C are perspective views of the bare cell of FIG. 3 combined with the protective circuit board.
Figure 4B:
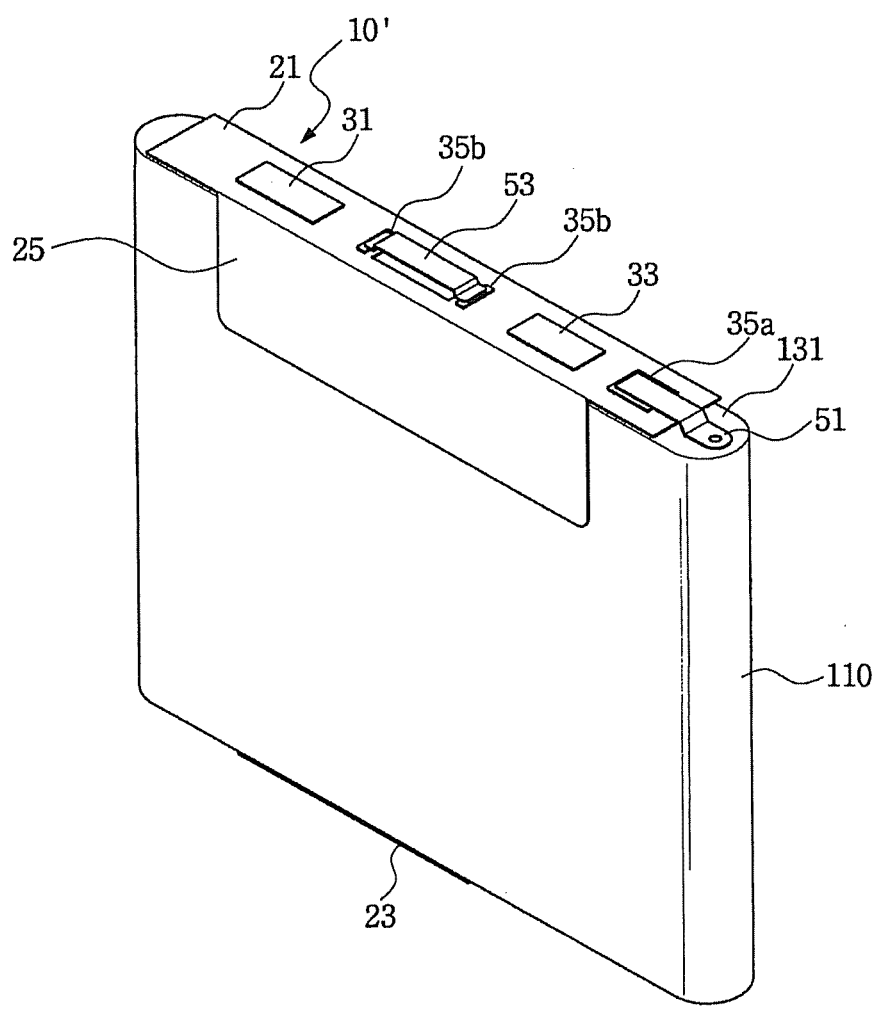
Figure 4C:
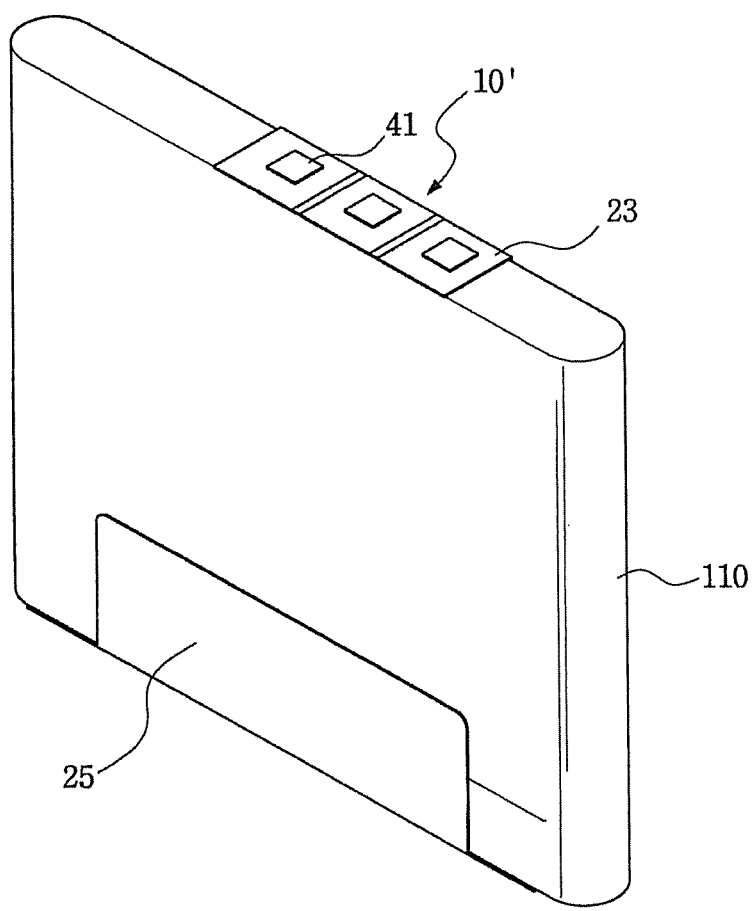
Figure 4D:
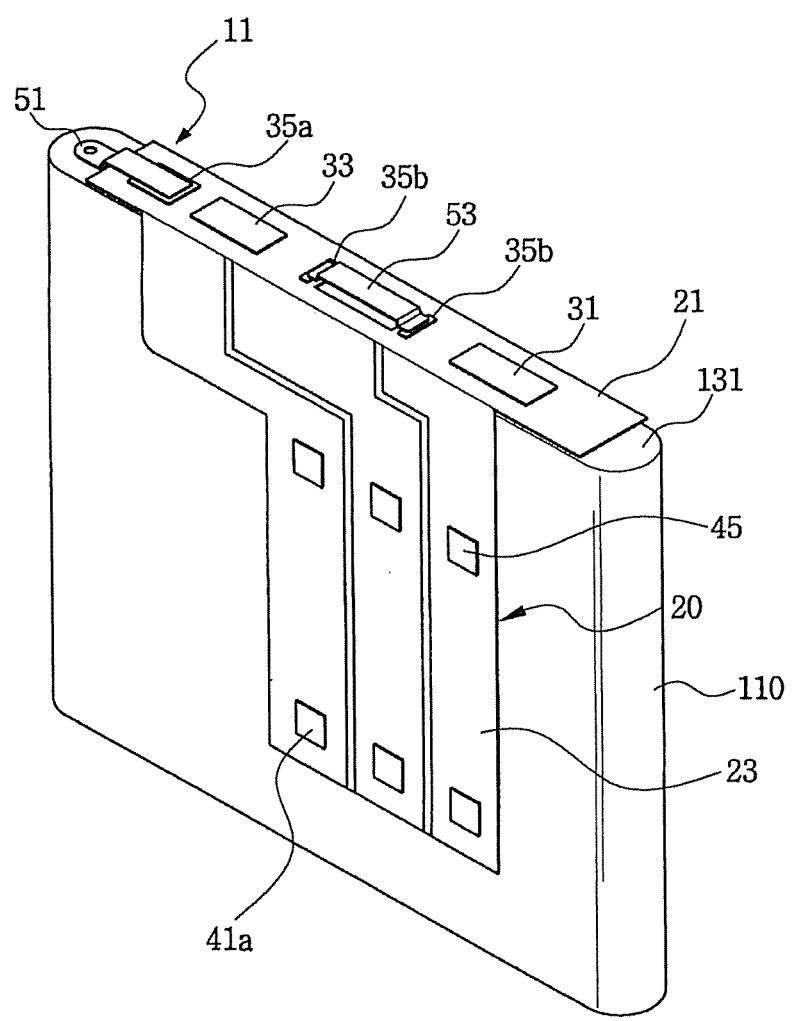
FIGS. 4D through 4F are perspective views of a position of an external connection terminal according to various exemplary embodiments.
Figure 4E:
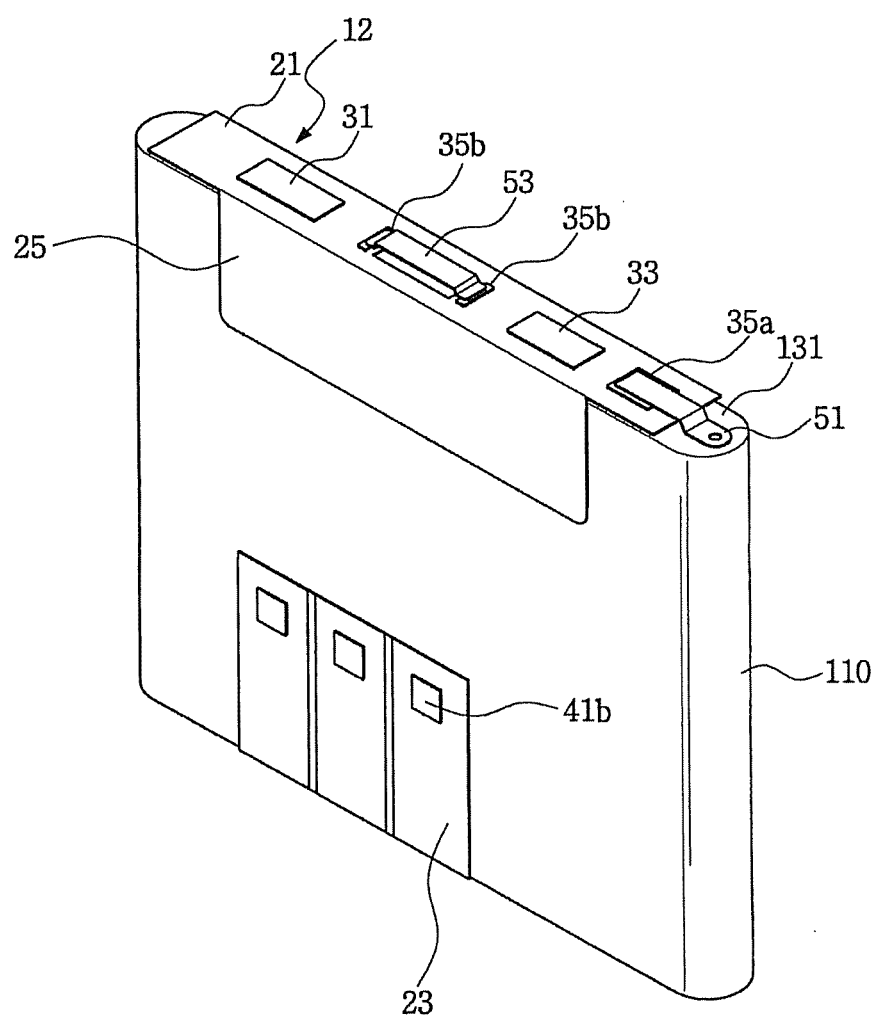
Figure 4F:
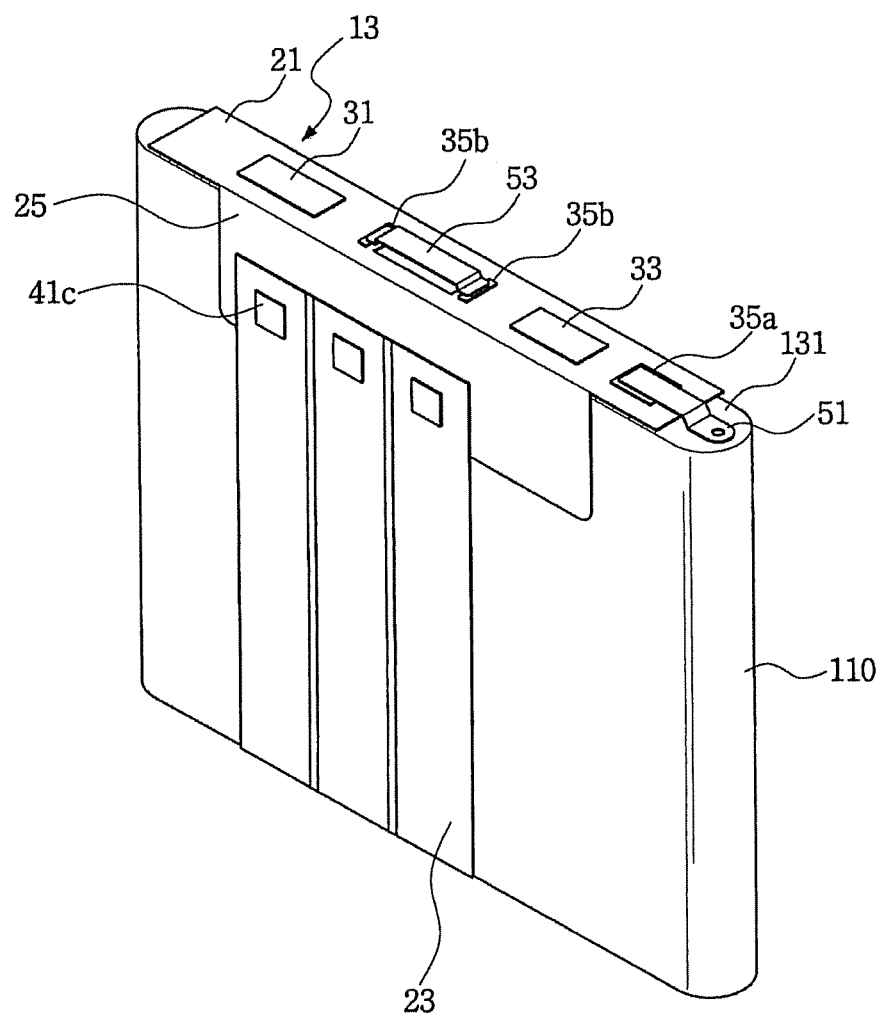

FIG. 3 is an exploded perspective view a battery pack according to another exemplary embodiment of the present invention, and FIGS. 4A through 4C are perspective views of a bare cell 100' of FIG. 3 combined with a protective circuit board 10', and FIGS. 4D through 4F are perspective views of a position of an external connection terminal according to various exemplary embodiments.

With reference to FIGS. 3, 4A, 4B, and 4C, the battery pack comprises the bare cell 100'; and a protective circuit board 10' positioned outside the bare cell 100', wherein the bare cell 100' is combined with the protective circuit board 10' by an adhesive or a double-sided tape 200 disposed therebetween.

The bare cell 100' has similar elements as those of the bare cell 100 of FIG. 2 and therefore, no further description thereof will be presented. Further, in the bare cell 100' of FIG. 3, elements that are same as those of the bare cell 100 of FIG. 2 will be indicated by using the same drawing reference numerals.

The outer shape of the bare cell 100' is formed by a can 110 forming an outer appearance, a cap plate 131 sealing an opening of the can 110, and an electrode terminal 132 insulated from the cap plate 131 by a gasket 133.

The double-sided tape 200 disposed between the protective circuit board 10' and the bare cell 100' may have various shapes. However, preferably, since the double-sided tape 200 is to bond the protective circuit board 10' to the bare cell 100', the double-sided tape 200 may have the same shape as that of the protective circuit board 10'.

Further the double-sided tape 200 includes an aperture 210 at a position corresponding to the position of the gasket 133 and the electrode terminal 132 formed in the bare cell 100' to expose the electrode terminal 132 therethrough.

The outer appearance of the battery pack may be formed by combining a top cover 300 with a top side of the bare cell 100' and a bottom cover 400 with a bottom side of the bare cell 100'. Then, when the external connection terminal 41 is positioned at the bottom of the bare cell 100', an aperture 410 is formed in the bottom cover 400 combined with the bottom side of the bare cell 100', to expose the external connection terminal 41 outside.

Further, the thickness of the bottom cover 400 is formed so as to be the same as the thickness of the external connection terminal 41 so that the thickness to form a reverse insertion preventing structure is not secured. Therefore, a reverse insertion preventing structure 310 may be formed on the top cover 300 combined with the top side of the bare cell 100' where the external connection terminal 41 is not positioned.

The battery pack may further comprise: a cell case 500 protecting the outer appearance of the battery pack. The cell case 500 may be formed by tubing or labeling on the outside of the bare cell 100'. The cell case 500 may be a hard case formed of plastic or aluminum materials and may be combined with the outside of the bare cell 100'.

The protective circuit board 10' of FIG. 3 includes similar elements as those of the protective circuit board 10 of FIGS. 1A through 1C, and therefore, no further description thereof will be presented. Further, in the protective circuit board 10' of FIG. 3, its constituents that are same as those of the protective circuit board 10 of FIGS. 1A through 1C will be indicated by using the same drawing reference numerals.

As shown in FIGS. 3 and 4A through 4C, the first region 21 of the protective circuit board 10', where the protection module 31, the PTC thermistor 33, and power terminals 35a and 35b are mounted, is positioned at the top of the bare cell 100' where the electrode terminal 132 is formed. The first lead plate 51 connected to the first power terminal 35a is connected to the cap plate 131 of the bare cell 100', and the second lead plate 53 connected to the second power terminal 35b is connected to the electrode terminal 132 of the bare cell 100'. The aperture 37 is formed in the first region 21 so as to correspond to the electrode terminal 132 of the bare cell 100', so that the second lead plate 53 partially exposed above the aperture 37 is connected to the electrode terminal 132 of the bare cell 100'. The protection module 31, the PTC thermistor 33, and the power terminals 35a and 35b are mounted in an upper surface of the FPCB 20, and the electrode terminal 132 is exposed exteriorly through the aperture 37. Therefore the protection module 31, the PTC thermistor 33, the power terminals 35a and 35b and the electrode terminal 132 are not disposed between the protective circuit board 10' and bare cell 100', thereby reducing the space between the protective circuit board 10' and bare cell 100'

The second region 23 of the protective circuit board 10', where the wire 43 for connecting the power terminals 35a and 35b to the external connection terminal 41 is formed, is positioned at a side of the bare cell 100', and the edge of the second region 23 including the external connection terminal 41 is bent to be positioned at the bottom of the bare cell 100'. However, as described above, aspects of the present invention are not limited thereto such that the first, second, and/or third regions 21, 23, and 25 may be located differently with respect to the bare cell 100, 100'.

As illustrated in FIG. 4D, an external connection terminal 41a of a protective circuit board 11 may be positioned at a side of the bare cell 100'. In this case, a cell case (not shown) covering the sides of the bare cell 100' is to be formed so that the external connection terminal 41a is exposed.

Further, as illustrated in FIG. 4E, an external connection terminal 41b of the second region 23 of a protective circuit board 12 may be formed so as to be positioned at the other side of the bare cell 100' where the third region 25 of the protective circuit board 12 is positioned. Specifically, the second region 23 of the protective circuit board 12 may extend from the first region 21 positioned at the top of the can 110, down one side of the can 110, around the bottom of the can 110, and back up the other side of the can 110.

Or, as illustrated in FIG. 4F, the external connection terminal 41c of the second region 23 of a protective circuit board 13 may be formed so as to overlap the third region 25. Specifically, the second region 23 of the protective circuit board 13 may extend from the first region 21 positioned at the top of the can 110, down one side of the can 110, around the bottom of the can 110, and back up the other side of the can 110 to overlap the third region 25.

When the external connection terminal 41 is positioned at the side of the bare cell 100', the reverse insertion preventing structure 310 of FIG. 3 may be formed at any position of the top cover 300 and the bottom cover 400.

Further, the third region 25 of the protective circuit board 10, 10', 11, 12, and 13 is positioned at the other side of the bare cell 100', opposing the side of the bare cell 100' where the second region 23 is positioned so as to strengthen the fixation between the protective circuit board 10'. However, aspects of the present invention do not limit the position of the third region 25.

In accordance with aspects of the present invention, the space for mounting a number of the protection devices and the space for forming the high current pattern are secured, and the work of mounting the protection devices and forming the high current pattern is easily performed.

Furthermore, in accordance with aspects of the present invention, since there is no need to compensate for the difference in the height between the protection element and the electrode terminal, the operability and proccessability are increased.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery pack, comprising:
   a bare cell including a cap plate, an electrode terminal, a first broad side surface, and a second broad side surface facing away from the first broad side surface;
   a case configured to accommodate the bare cell therein; and
   a protective circuit board comprising a flexible printed circuit board as a separate piece from the case, wherein the flexible printed circuit board comprises a first region, a second region, and a third region, the first region being located between the second and third regions, the protective circuit board further comprising: a protection module, a PTC thermistor, and first and second power terminals that are mounted on the first region, wherein the first region is folded relative to the second and third regions, such that the first region is placed on the cap plate, that the second region is inserted between the first broad side surface and a wall of the case, and that the third region is inserted between the second broad side surface and another wall of the case.

2. The battery pack of claim 1, wherein the third region is formed to oppose the second region.

3. The battery pack of claim 2, wherein the second region extends around a bottom of the bare cell so that an external connection terminal is disposed at a side of the bare cell on which the third region is disposed.

4. The battery pack of claim 3, wherein the external connection terminal is positioned so as to overlap the third region.

5. The battery pack of claim 1, wherein the electrode terminal is formed at a top of the bare cell and the first region of the protective circuit board is disposed to correspond to the electrode terminal.

6. The battery pack of claim 1, wherein the second region is disposed at one side of the bare cell.

7. The battery pack of claim 6, wherein an external connection terminal is disposed on the one side of the bare cell.

8. The battery pack of claim 6, wherein the third region is disposed at an other side of the bare cell, opposing to the side of the bare cell at which the second region is disposed.

9. The battery pack of claim 1, wherein an external connection terminal is disposed at a bottom of the bare cell.

10. The battery pack of claim 1, wherein the protective circuit board further comprises a test terminal formed in the second region.

11. The battery pack of claim 1, further comprising:
    a top cover disposed to cover the top side of the bare cell; and
    a bottom cover disposed to cover the bottom side of the bare cell.

12. The battery pack of claim 11, wherein at least one of the top cover and the bottom cover includes a reverse insertion preventing structure.

13. The battery pack of claim 1, further comprising an adhesive disposed between the protection circuit board and the bare cell.

* * * * *